United States Patent
Boday et al.

(10) Patent No.: US 10,093,764 B2
(45) Date of Patent: Oct. 9, 2018

(54) BLOCK COPOLYMERS IN LAMINATE MANUFACTURING

(71) Applicant: International Business Machines Corporation, Armonk, NY (US)

(72) Inventors: Dylan J. Boday, Tucson, AZ (US); Joseph Kuczynski, North Port, FL (US); Timothy C. Mauldin, Tucson, AZ (US)

(73) Assignee: International Business Machines Corporation, Armonk, NY (US)

( * ) Notice: Subject to any disclaimer, the term of this patent is extended or adjusted under 35 U.S.C. 154(b) by 629 days.

(21) Appl. No.: 14/834,131

(22) Filed: Aug. 24, 2015

(65) Prior Publication Data

US 2016/0145400 A1 May 26, 2016

Related U.S. Application Data

(63) Continuation of application No. 14/549,729, filed on Nov. 21, 2014, now Pat. No. 9,879,110.

(51) Int. Cl.
| | |
|---|---|
| *C08J 3/24* | (2006.01) |
| *H05K 3/00* | (2006.01) |
| *H05K 3/46* | (2006.01) |
| *C08F 299/00* | (2006.01) |
| *H05K 1/03* | (2006.01) |

(52) U.S. Cl.
CPC ............... *C08F 299/00* (2013.01); *C08J 3/24* (2013.01); *H05K 1/0366* (2013.01); *H05K 3/0011* (2013.01); *H05K 3/46* (2013.01); *H05K 3/4602* (2013.01); *C08J 2343/04* (2013.01); *H05K 1/034* (2013.01)

(58) Field of Classification Search
CPC .................................................... C08F 299/00
See application file for complete search history.

(56) References Cited

U.S. PATENT DOCUMENTS

| | | | |
|---|---|---|---|
| 2,776,910 | A | 1/1957 | Erickson et al. |
| 4,094,818 | A | 6/1978 | Langer, Jr. |
| 4,126,730 | A | 11/1978 | Molari, Jr. |
| 5,071,701 | A | 12/1991 | Tenney et al. |
| 6,617,021 | B2 | 9/2003 | Kobayashi et al. |
| 8,211,982 | B2 | 7/2012 | Harris et al. |

(Continued)

FOREIGN PATENT DOCUMENTS

| | | |
|---|---|---|
| JP | 04175354 A | 6/1992 |
| JP | 2008000985 A | 1/2008 |

(Continued)

OTHER PUBLICATIONS

Binfield et al., "Conductive Anodic Filaments: The Role of Epoxy-Glass Adhesion", DfR Solutions LLC, printed from <http://www.dfrsolutions.com/wp-content/uploads/2012/06/Conductive-Anodic-Filaments-The-Role-of-Epoxy-Glass-Adhesion.pdf> on Oct. 1, 2014, 6 pages.

(Continued)

*Primary Examiner* — Ian Rummel
(74) *Attorney, Agent, or Firm* — Matthew J. Bussan

(57) ABSTRACT

A block copolymer is synthesized by polymerizing a silane-functionalized norbornene monomer in the presence of a catalyst system that includes a Ziegler-Natta catalyst and cocatalyst, followed by sequential addition and polymerization of a matrix-reactive functionalized norbornene monomer. In some embodiments, an enhanced substrate for a PCB is produced by applying the block copolymer to a substrate that includes glass fiber, followed by applying the base polymer to the substrate having the block copolymer applied thereto.

17 Claims, 3 Drawing Sheets

(56) References Cited

U.S. PATENT DOCUMENTS

2009/0043059 A1 2/2009 Liaw et al.
2010/0294363 A1 11/2010 Gust
2012/0010380 A1 1/2012 Yoo et al.
2012/0264884 A1 10/2012 Liu et al.

FOREIGN PATENT DOCUMENTS

| KR | 1020080067425 A | 7/2008 |
|---|---|---|
| KR | 1020080067427 A | 7/2008 |
| WO | 2008082128 A1 | 7/2008 |

OTHER PUBLICATIONS

"102HT—Hi-Temp Toughened Structural Adhesive", Rhino Linings Corporation, printed from <http://www.rhinoliningsepoxy.com/products/specialty_products/102ht_-_hi-temp_toughened_structural_adhesive/256/312> on Oct. 1, 2014, 2 pages.

Allred, et al., "Reactive Finishes for Improving Adhesion in Carbon/Vinyl Ester Laminates", Proceedings of the 49th International Society for the Advancement of Material and Process Engineering (SAMPE) Symposium, Long Beach, California, May 17-20, 2004, 15 pages.

Mohd, Zulfli et al., "Mechanical and Thermal Behaviours of Glass Fiber Reinforced Epoxy Hybrid Composites Containing Organo-Montmorillonite Clay", Malaysian Polymer Journal, vol. 7, No. 1, 2012, pp. 8-15.

Janiak et al., "Metal catalysts for the vinyl polymerization of norbornene", Journal of Molecular Catalysis A: Chemical 2981, 2000, pp. 1-17.

List of IBM Patents or Patent Applications Treated as Related.

U.S. Appl. No. 14/549,729, to Boday et al., entitled "Block Copolymers in Laminate Manufacturing", filed Nov. 21, 2014, assigned to International Business Machines Corporation.

BLOCK COPOLYMERS IN LAMINATE MANUFACTURING

CROSS-REFERENCE TO RELATED APPLICATION

This patent application is a continuation application of pending U.S. patent application Ser. No. 14/549,729, filed Nov. 21, 2014, entitled "BLOCK COPOLYMERS IN LAMINATE MANUFACTURING", which is hereby incorporated herein by reference in its entirety.

BACKGROUND

The present invention relates in general to block copolymers for use as a glass-to-resin coupling agent in making printed circuit boards. More particularly, the present invention relates to AB-type block copolymers having an A block with a polynorborene backbone and silane pendant groups capable of bonding to a glass surface and a B block with a polynorbornene backbone and matrix-reactive pendant groups capable of reacting with a base polymer.

SUMMARY

In accordance with some embodiments of the present invention, a block copolymer is synthesized by polymerizing a silane-functionalized norbornene monomer in the presence of a catalyst system that includes a Ziegler-Natta catalyst and cocatalyst, followed by sequential addition and polymerization of a matrix-reactive functionalized norbornene monomer. In some embodiments, an enhanced substrate for a PCB is produced by applying the block copolymer to a substrate that includes glass fiber, followed by applying the base polymer to the substrate having the block copolymer applied thereto.

BRIEF DESCRIPTION OF THE SEVERAL VIEWS OF THE DRAWINGS

Embodiments of the present invention will hereinafter be described in conjunction with the appended drawings, where like designations denote like elements.

DETAILED DESCRIPTION

Figure 1:
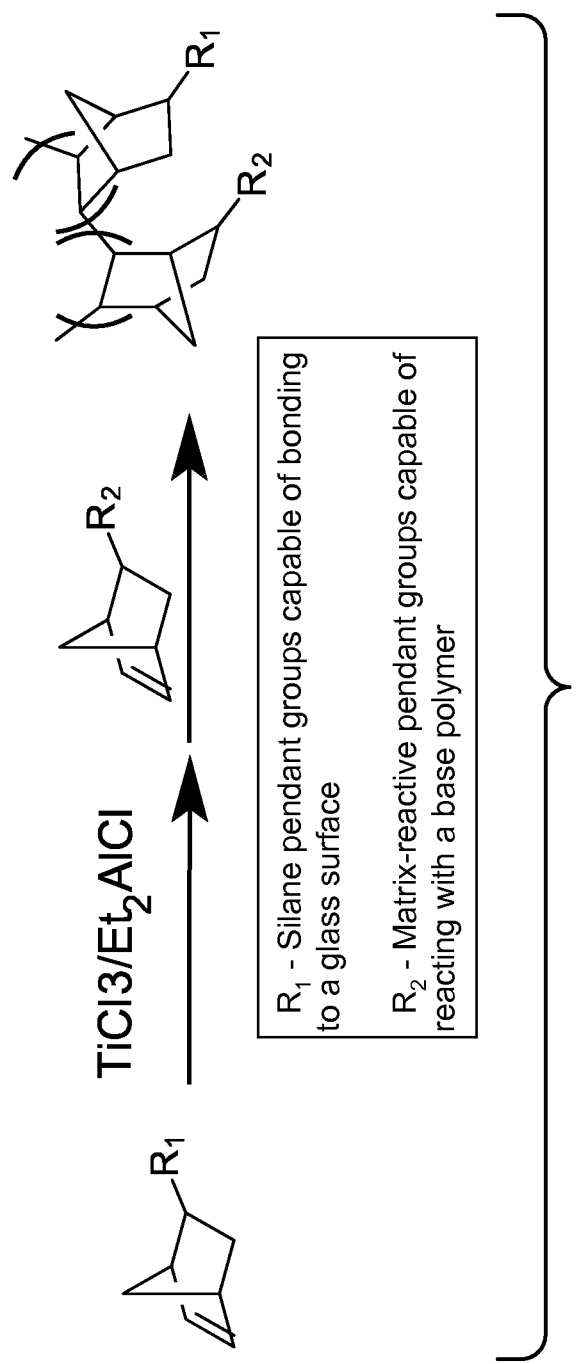
FIG. 1 is a chemical reaction diagram showing the synthesis of a block copolymer using Ziegler-Natta polymerization in accordance with some embodiments of the present invention.

The basic concept behind a coupling agent is to join two disparate surfaces. In the case of printed circuit boards (PCBs), a silane coupling agent is often used to join a varnish coating (e.g., an epoxy-based resin) to a substrate (e.g., glass cloth) to define a laminate, or laminated structure. The silane coupling agent typically consists of an organofunctional group to bind to the varnish coating and a hydrolyzable group (typically, one or more alkoxy groups on a silicon atom) that binds to the surface of the substrate. In particular, the alkoxy groups on the silicon atom hydrolyze to silanols, either through the addition of water or from residual water on the surface of the substrate. Subsequently, the silanols react with hydroxyl groups on the surface of the substrate to form a siloxane bond (Si—O—Si) and eliminate water.

For the specific case of epoxy-based laminates, the organofunctional group that has been found to exhibit desirable performance based on numerous criteria is vinylbenzylaminoethylaminopropyl and also benzylaminoethylaminopropyl. Silane coupling agents, which include this organofunctional group, are thought to covalently bond to the epoxide functional groups of the traditional epoxy-based resin, such as the well known FR4 epoxy resins, through the secondary nitrogens of the amino groups. While a plethora of silane coupling agents exists, the industry workhorse for coupling epoxy-based resins has been vinylbenzylaminoethylaminopropyltrimethoxysilane (commercially available as Dow Corning Z-6032).

The PCB industry has recently migrated away from the traditional FR4 epoxy based resins (due to lead-free requirements and the higher soldering temperatures associated with tin-silver-copper alloys). Hence, current varnish coatings are typically no longer comprised of FR4 epoxies, rather they are more likely to be vinyl-containing resins such as triallylcyanurate, bismaleimide triazine (BT) resins or polyphenylene oxide/trially-isocyanurate (PPO/TAIC) interpenetrating networks. Typically, vinylbenzylaminoethylaminopropyltrimethoxysilane, originally developed for traditional FR4 epoxies, is still the coupling agent utilized to couple, or bond, the glass cloth substrate to the laminate varnish. However, other silane coupling agents, such as diallylpropylisocyanuratetrimethoxysilane, have been proposed for use in making high-temperature PCBs.

In accordance with some embodiments of the present invention, an AB-type block copolymer for use in printed circuit board (PCB) fabrication is provided having a structure represented by the following formula:

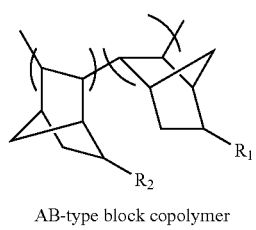

AB-type block copolymer wherein $R_1$ is a silane pendant group that includes a silicon-containing moiety capable of bonding to a glass surface, and wherein $R_2$ is a matrix-reactive pendant group that includes at least one moiety (e.g., a vinyl-, allyl- amine-, amide- or epoxy-containing moiety) capable of reacting with a base polymer. In the AB-type block copolymer, the A-block contains the silane pendant groups ($R_1$) to bond to glass cloth, for example, and the B-block contains the matrix-reactive pendant groups ($R_2$) capable of reacting with the base polymer (e.g., if the base polymer is epoxy, the B-block may contain amine/amide/epoxy/etc. functionality, for example; if the base polymer is a vinyl-containing resin such as triallylcyanurate, the B-block may contain vinyl- and/or allyl-reactive groups, for example). In accordance with some embodiments of the present invention, the AB-type block copolymer may be used to replace conventional silane coupling agents (i.e., a solvent bath containing the AB-type block copolymer may be used in the finishing step of the glass treatment process). The A-block containing the silane pendant groups ($R_1$) would bind to the glass surface and the B-block containing the matrix-reactive pendant groups ($R_2$) would then be available to react with the base polymer.

The AB-type block copolymer in accordance with some embodiments of the present invention possesses a number of advantages over conventional silane coupling agents. First, the AB-type block copolymer in accordance with some embodiments of the present invention provides multidentate bonding to the glass surface (i.e., the A-block provides multiple attachment points to the glass fiber). Second, the AB-type block copolymer in accordance with some embodiments of the present invention provides a stronger interface (relative to conventional silane coupling agents) between the glass surface and the copolymer (due to the multidentate functionality provided by the A-block) as well as between the copolymer and the base polymer (due to the multidentate functionality provided by the B-block). Third, the AB-type block copolymer in accordance with some embodiments of the present invention can be coated onto the glass surface using a solvent containing the copolymer and, thus, glass cleanliness is improved.

Conventional silane coupling agents are typically monomeric trialkoxy silanes that condense on the glass surface. The organic functionality of the bound silane is then free to react with the base polymer. However, reactivity of the silane with the base polymer is often compromised by premature condensation of the trialkoxy groups of the silane with themselves (rather than with the glass cloth) to form loosely adhering oligomer/polymer. Moreover, the silane has only a single reactive organofunctional group which may provide inadequate coupling to the base polymer. By preparing an AB-type block copolymer with appropriate functionality in accordance with some embodiments of the present invention, these issues present in conventional silane coupling agents can be eliminated.

In accordance with some embodiments of the present invention, the block copolymer is synthesized by polymerizing a silane-functionalized norbornene monomer in the presence of a catalyst system that includes a Ziegler-Natta catalyst and cocatalyst, followed by sequential addition and polymerization of a matrix-reactive functionalized norbornene monomer (see FIG. 1, described below).

In accordance with some embodiments of the present invention, an enhanced substrate for a PCB is produced by applying the block copolymer to a substrate that includes glass fiber (see FIG. 2, described below), followed by applying the base polymer to the substrate having the block copolymer applied thereto. In some embodiments, the block copolymer may be applied directly to the glass fiber as the glass fiber is being pulled from the molten state. This eliminates the conventional glass sizing (typically, the sizing is starch based) and subsequent glass cleaning processes required to remove the sizing. Alternatively, in other embodiments, the block copolymer can be used to replace the conventional silane coupling agent in a conventional silane bath. That is, the glass cloth (which has been baked to remove the starch-based sizing) can be processed through an appropriate solvent bath containing the block copolymer. The silane pendant groups ($R_1$) (e.g., trialkoxy silane) of the A-block condense on the glass cloth leaving the matrix-reactive pendant groups ($R_2$) (e.g., vinyl groups) of the B-block available for reaction with the base polymer.

FIG. 1 is a chemical reaction diagram showing the synthesis of a block copolymer using Ziegler-Natta polymerization in accordance with some embodiments of the present invention. In the first step of the synthetic procedure shown in FIG. 1, a silane-functionalized norbornene monomer is polymerized in the presence of a multi-component catalyst system comprising a Ziegler-Natta catalyst and cocatalyst (e.g., $TiCl_3$ and $Et_2AlCl$) using Ziegler-Natta polymerization to produce a polynorbornene homopolymer. The silane-functionalized norbornene monomer is represented by the following formula:

Silane-functionalized norbornene monomer wherein $R_1$ is a silane pendant group that includes a silicon-containing moiety capable of bonding with a glass surface. Any suitable silane-functionalized norbornene monomer may be used in the first step of the synthetic procedure shown in FIG. 1. Suitable silane-functionalized norbornene monomers include norbornene monomers functionalized with a silane group $R_1$ having a silicon atom attached to the norbornene molecule either directly or through a linking structure. In the former case, $R_1$ is represented by the formula —$Si(A_1,A_2,A_3)$. In the latter case, $R_1$ is represented by the formula —L—$Si(A_1,A_2,A_3)$. $A_1$, $A_2$, and $A_3$ are each independently an alkyl group of $C_1$-$C_{10}$, an alkoxy group of $C_1$-$C_4$, an aryl group of $C_6$-$C_{12}$, an aryl group substituted of $C_6$-$C_{12}$ by an alkyl group of $C_1$-$C_{12}$, or a halogen atom (e.g., a chlorine atom). L is a linking structure for linking the norbornene molecule to the silicon atom. Generally, L is an alkyl group of $C_2$-$C_{10}$, an alkene group of $C_2$-$C_{10}$, a cycloalkyl group of $C_6$-$C_{12}$, a cycloalkane group of $C_6$-$C_{12}$, an aryl group of $C_6$-$C_{12}$, an aryl group of $C_6$-$C_{12}$ substituted by an alkyl group of $C_1$-$C_{10}$, or a structure represented by any of the Linking Structures 1 to 4, represented by the following formulas:

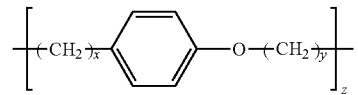

Linking Structure 1

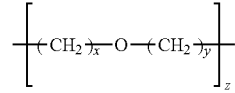

Linking Structure 2

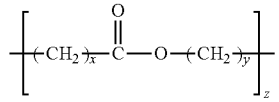

Linking Structure 3

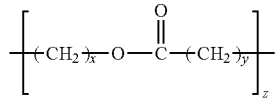

Linking Structure 4 wherein x is an integer from 0 to 2, y is an integer from 0 to 3, and z is an integer from 0 to 2.

Suitable silane-functionalized norbornene monomers may be obtained commercially or synthesized using synthetic procedures well known in the art. For example, numerous silane-functionalized norbornene monomers and synthetic procedures that may be utilized to prepare them are disclosed in U.S. Pat. No. 5,071,701 and International Publication Number WO 2008/082128 A1, each of which is incorporated herein by reference.

A suitable silane-functionalized norbornene monomer containing a conventional trialkoxysilane, for example, may be synthesized by hydrosilylation of vinyl norbornene (CAS No. 3048-64-4) with triethoxysilane (CAS No. 998-30-1) and a platinum-based catalyst as shown in Reaction Scheme 1 as follows:

Reaction Scheme 1

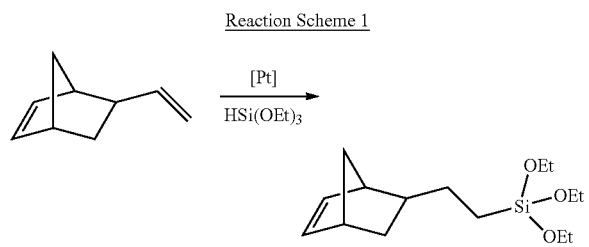

PROPHETIC EXAMPLE 1

Into a flask containing 5-vinyl-2-norbornene (60.1 g, 500 mmol) and chloroplatinic acid solution (H$_2$PtCl$_6$) (0.04 g, 0.1 mmol) diluted in isopropanol at 80 ° C., triethoxysilane (98.6 g, 600 mmol) is added dropwise through a dropping funnel over two hours. The reaction is then performed at 80° C. for 18 hours, after which the solvent is removed in vacuo. *End of Prophetic Example 1*

A suitable silane-functionalized norbornene monomer containing a dimethylsilyl chloride, for example, may be synthesized by hydrosilylation of vinyl norbornene (CAS No. 3048-64-4) with chlorodimethylsilane (CAS No. 1066-35-9) and a platinum-based catalyst as shown in Reaction Scheme 2 as follows:

Reaction Scheme 2

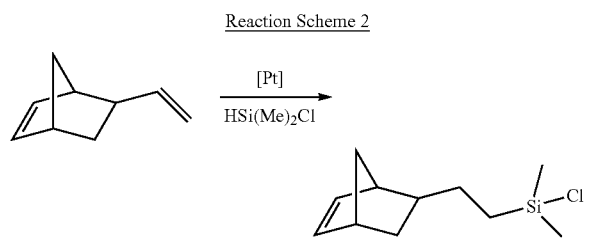

Analogous silyl chloride norbornene monomers (e.g., dialkoxysilyl chloride- and trichlorosilyl-containing norbornene monomers) can be similarly synthesized by hydrosilation.

PROPHETIC EXAMPLE 2

Into a flask containing 5-vinyl-2-norbornene (60.1 g, 500 mmol) and chloroplatinic acid solution (H$_2$PtCl$_6$) (0.04 g, 0.1 mmol) diluted in isopropanol at 80 ° C., chlorodimethylsilane (56.8 g, 600 mmol) is added dropwise through a dropping funnel over two hours. The reaction is then performed at 80° C. for 18 hours, after which the solvent is removed in vacuo. *End of Prophetic Example 2*

In the second step of the synthetic procedure shown in FIG. 1, a matrix-reactive functionalized norbornene monomer is polymerized in the presence of the polynorbornene homopolymer and a multi-component catalyst system comprising a Ziegler-Natta catalyst and cocatalyst (e.g., TiCl$_3$ and Et$_2$AlCl) using sequential addition and Ziegler-Natta polymerization. The matrix-reactive functionalized norbornene monomer is represented by the following formula:

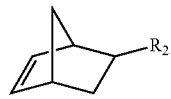

Matrix-reactive functionalized norbornene monomer wherein R$_2$ is a matrix-reactive pendant group that includes at least one moiety (e.g., a vinyl-, allyl-, amine-, amide- or epoxy-containing moiety) capable of reacting with a base polymer. Any suitable matrix-reactive functionalized norbornene monomer may be used in the second step of the synthetic procedure shown in FIG. 1. Suitable reactive-matrix functionalized norbornene monomers are norbornene monomers functionalized with a matrix-reactive group R$_2$ that includes at least one moiety (e.g., a vinyl-, allyl-, amine-, amide-, or epoxy-containing moiety) capable of reacting with a base polymer. Suitable reactive-matrix functionalized norbornene monomers include norbornene monomers functionalized with a matrix-reactive group R$_2$ having at least one reactive moiety attached to the norbornene molecule either directly (e.g., vinyl norbornene and allyl norbornene) or through a linking structure. In the former case, R$_2$ is represented by the formula —X. In the latter case, R$_2$ is represented by the formula —L—X. X is a moiety capable of reacting with a base polymer. L is a linking structure for linking the norbornene molecule to the reactive moiety. L is an alkyl group of C$_2$-C$_{10}$, an alkene group of C$_2$-C$_{10}$, a cycloalkyl group of C$_6$-C$_{12}$, a cycloalkane group of C$_6$-C$_{12}$, an aryl group of C$_6$-C$_{12}$, an aryl group of C$_6$-C$_{12}$ substituted by an alkyl group of C$_1$-C$_{10}$, or a structure represented by any of the Linking Structures 1 to 4, above.

Suitable reactive-matrix functionalized norbornene monomers that include a vinyl-containing moiety include, but are not limited to, vinyl norbornene (CAS No. 3048-64-4). Suitable reactive-matrix functionalized norbornene monomers that include a vinyl-containing moiety may be obtained commercially or synthesized using synthetic procedures well known in the art.

Suitable reactive-matrix functionalized norbornene monomers that include an allyl-containing moiety include, but are not limited to, allyl norbornene (CAS No. 31663-53-3). Suitable reactive-matrix functionalized norbornene monomers that include an allyl-containing moiety may be obtained commercially or synthesized using synthetic procedures well known in the art.

Suitable reactive-matrix functionalized norbornene monomers that include an amine-containing moiety include, but are not limited to, 5-norbornene-2-methylamine (CAS No. 95-10-3). Suitable reactive-matrix functionalized norbornene monomers that include an amine-containing moiety may be obtained commercially or synthesized using synthetic procedures well known in the art.

Suitable reactive-matrix functionalized norbornene monomers that include an amide-containing moiety include, but are not limited to, 5-norbornene-2-carboxamide (CAS No. 95-17-0). Suitable reactive-matrix functionalized norbornene monomers that include an amide-containing moiety may be obtained commercially or synthesized using synthetic procedures well known in the art.

Suitable reactive-matrix functionalized norbornene monomers that include an epoxy-containing moiety include, but are not limited to, the norbornene monomer with a terminal epoxy group (NBMGE) represented by the following formula:

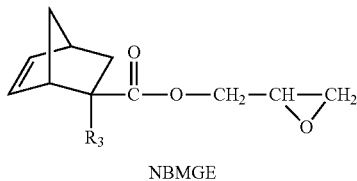

NBMGE wherein $R_3$ is a hydrogen atom or a methyl group. Suitable reactive-matrix functionalized norbornene monomers that include an epoxy-containing moiety may be obtained commercially or synthesized using synthetic procedures well known in the art. For example, NBMGE and other norbornene monomers with an epoxy group and synthetic procedures that may be utilized to prepare them are disclosed in U.S. Patent Application Publication No. 2009/0043059 A1, which is incorporated herein by reference.

In FIG. 1, the Ziegler-Natta polymerizations are performed using $TiCl_3$ and $Et_2AlCl$ as the Ziegler-Natta catalyst and cocatalyst combination. One skilled in the art will appreciate that any suitable Ziegler-Natta catalyst and cocatalyst combination may be used in lieu of, or in addition to, $TiCl_3/Et_2AlCl$. Each of the Ziegler-Natta polymerizations is performed at an appropriate temperature that is typically dependent, at least in part, on the particular Ziegler-Natta catalyst and cocatalyst combination selected. For example, when $TiCl_3$ and $Et_2AlCl$ are respectively selected as the Ziegler-Natta catalyst and cocatalyst, the reaction is typically heated to between 80 to 100° C.

In a first example, a trialkoxysilane-containing norbornene monomer (i.e., the triethoxysilane-containing norbornene monomer synthesized via Reaction Scheme 1) is polymerized with a Ziegler-Natta catalyst and cocatalyst combination (i.e., $TiCl_{13}/Et_2AlCl$ shown in this example), followed by sequential addition and polymerization of vinyl norbornene monomer to form the AB-type block copolymer as shown in Reaction Scheme 3 as follows:

Reaction Scheme 3

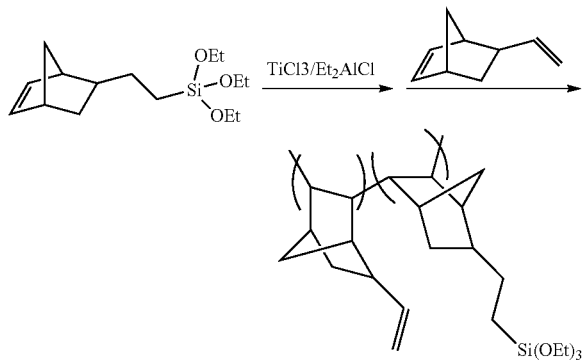

The AB-type block copolymer produced via Reaction Scheme 3, above, contains trialkoxysilane functionalities that can react with glass fiber surfaces via conventional silane coupling agent treatments (i.e., at elevated temperatures). For example, a sheet of woven glass fiber may be soaked for a suitable period of time (e.g., 5 minutes to 12 hours) in a solvent bath containing a solution heated to a suitable temperature (e.g., 0 to 100° C.) of the AB-type block copolymer produced via Reaction Scheme 3, above, dissolved in a suitable solvent (e.g., dimethyl sulfoxide (DMSO) or dimethylformamide (DMF)).

PROPHETIC EXAMPLE 3

In an $N_2$-filled glovebox, titanium(III) chloride ($TiCl_3$) (0.77 g, 5 mmol), diethylaluminum chloride ($Et_2AlCl$) (0.6 g, 5 mmol), and toluene (250 mL) are added into a resin flask. The mixture is then stirred. Some of the triethoxysilane-containing norbornene monomer synthesized in Prophetic Example 1 (42 g, 150 mmol) is added to the flask, which is then sealed and removed from the glovebox. The reaction is stirred at 60° C. until polymerization is complete (approximately 4 hours). At this point, the flask is returned to the glovebox and vinyl norbornene monomer (18 g, 150 mmol) is added to the flask, which is again sealed and removed from the glovebox. The reaction is stirred at 60° C. for 4 hours. The polymerization is then quenched via addition of acidic ethanol. The AB-type block copolymer is collected via filtration and washed with acetone. The resulting product is then dried overnight. *End of Prophetic Example 3*

In a second example, a dialkylsilyl chloride-containing norbornene monomer (i.e., the dimethylsilyl chloride-containing norbornene monomer synthesized via Reaction Scheme 2) is polymerized with a Ziegler-Natta catalyst and cocatalyst combination (i.e., $TiCl_3/Et_2AlCl$ shown in this example), followed by sequential addition and polymerization of vinyl norbornene monomer to form the AB-type block copolymer as shown in Reaction Scheme 4 as follows:

Reaction Scheme 4

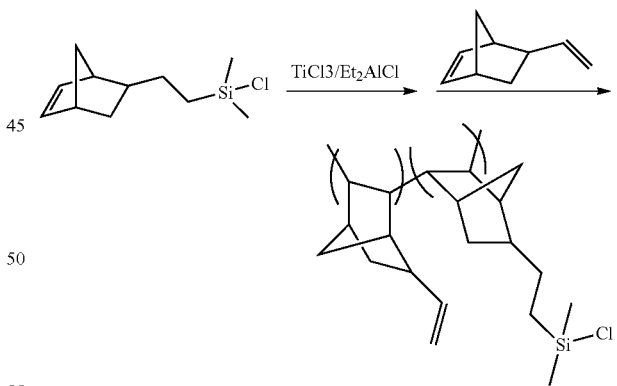

The labile silyl chloride in the AB-type block copolymer produced via Reaction Scheme 4, above, is capable of forming covalent bonds to glass fiber surfaces at ambient temperatures, which is compatible with some laminate manufacturing procedures. One skilled in the art will appreciate that analogous silyl chloride norbornene monomers (e.g., dialkoxysilyl chloride- and trichlorosilyl-containing norbornene monomers) can be used lieu of, or in addition to, the dimethylsilyl chloride-containing norbornene monomer in Reaction Scheme 4, above. Generally, AB-type block copolymers containing such silyl chloride matrix-reactive pendant groups are relatively more reactive (as compared to, for example, AB-type block copolymers containing trialkoxysilane matrix-reactive pendant groups) and, hence, typically react spontaneously with the glass fiber surfaces at room temperature. For example, a sheet of woven glass fiber may be dipped for a suitable period of time (e.g., 5 seconds to 120 minutes) in a solvent bath containing a solution at room temperature of the AB-type block copolymer produced via Reaction Scheme 4, above, dissolved in a suitable solvent (e.g., dimethyl sulfoxide (DMSO) or dimethylformamide (DMF)).

PROPHETIC EXAMPLE 4

In an $N_2$-filled glovebox, titanium(III) chloride ($TiCl_3$) (0.77 g, 5 mmol), diethylaluminum chloride (Et2AlCl) (0.6 g, 5 mmol), and toluene (250 mL) are added into a resin flask. The mixture is then stirred. Some of the dimethylsilyl chloride-containing norbornene monomer synthesized in Prophetic Example 2 (32.2 g, 150 mmol) is added to the flask, which is then sealed and removed from the glovebox. The reaction is stirred at 60° C. until polymerization is complete (approximately 4 hours). At this point, the flask is returned to the glovebox and vinyl norbornene monomer (18 g, 150 mmol) is added to the flask, which is again sealed and removed from the glovebox. The reaction is stirred at 60° C. for 4 hours. The polymerization is then quenched via cooling the reaction to room temperature while open to air. The solution is precipitated into hexanes and the AB-type block copolymer is collected via filtration and washed with hexanes. The resulting product is then dried overnight.
*End of Prophetic Example 4*

Figure 2:
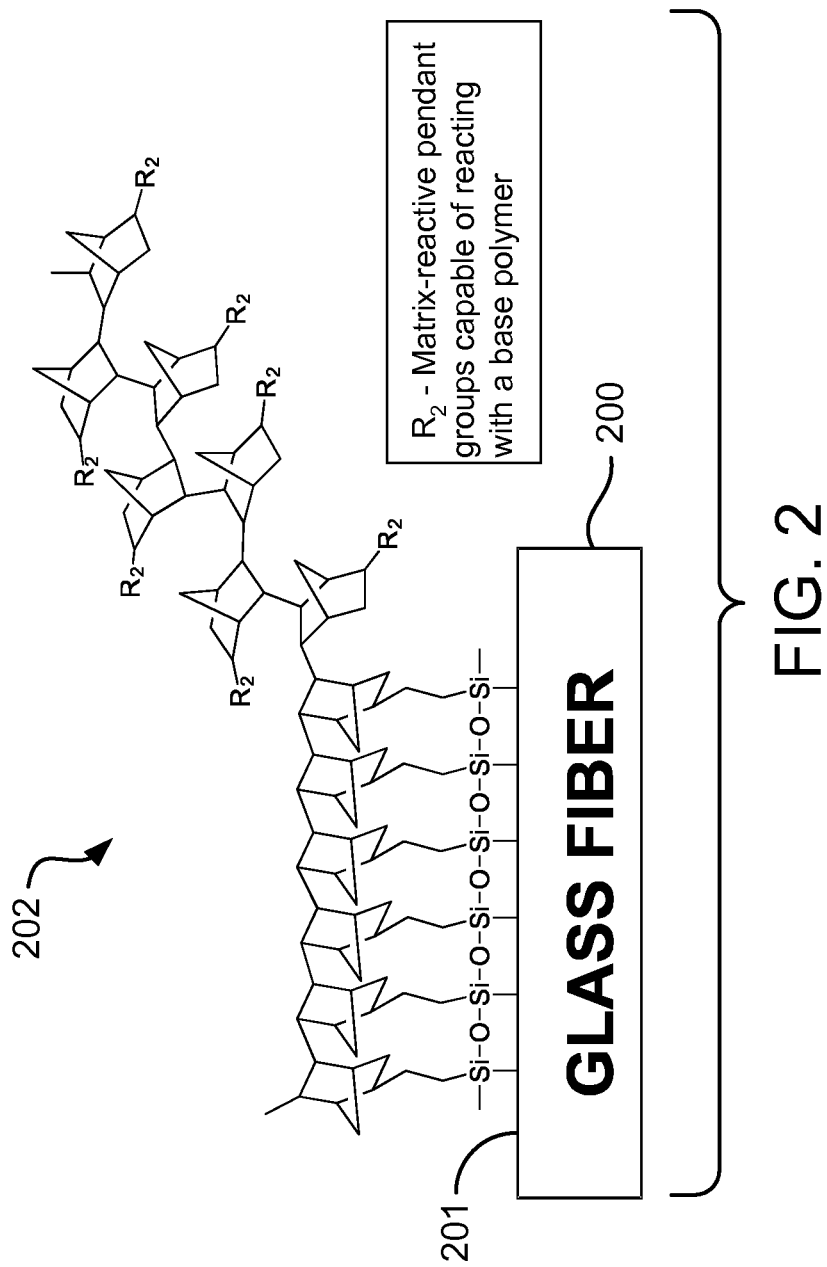
FIG. 2 is a block diagram showing a glass fiber substrate having its surface modified by a block copolymer in accordance with some embodiments of the present invention.

FIG. 2 is a block diagram showing a glass fiber substrate 200 having its surface 201 modified by an AB-type block copolymer 202 in accordance with some embodiments of the present invention. In the AB-type block copolymer 202 shown in FIG. 2, $R_2$ represents the matrix-reactive pendant groups each of which includes at least one moiety (e.g., a vinyl-, allyl-, amine-, amide- or epoxy-containing moiety) capable of reacting with a base polymer. The glass fiber substrate 200 having its surface 201 modified by the AB-type block copolymer 202 may then incorporated be incorporated into conventional composite processing techniques.

Figure 3:
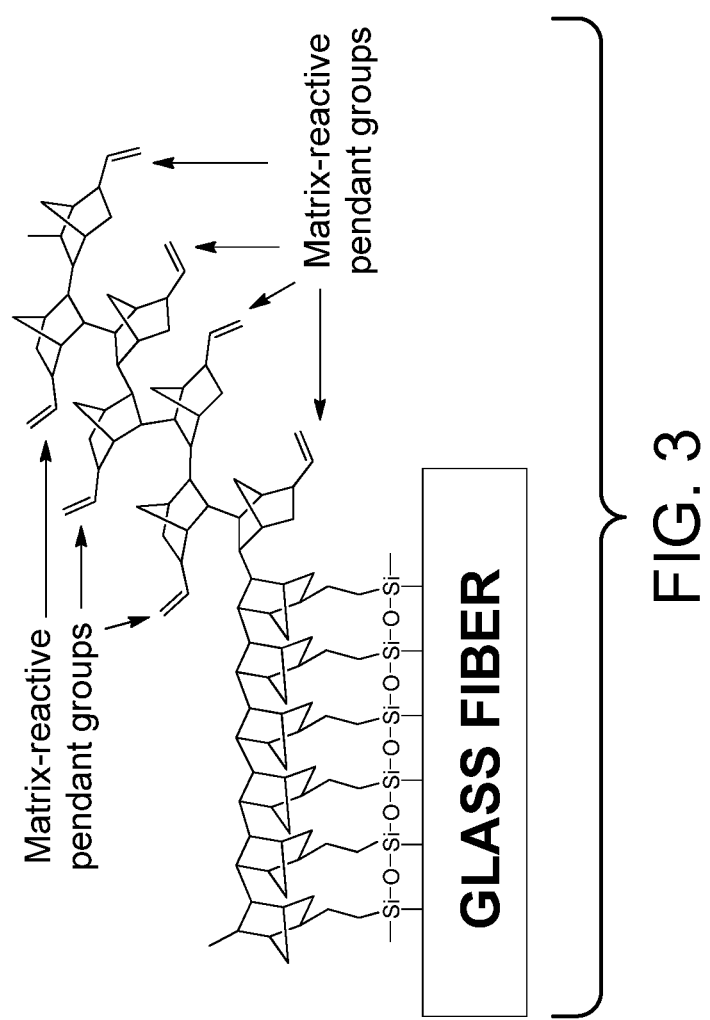
FIG. 3 is a block diagram showing a glass fiber substrate having its surface modified by an AB-type block copolymer having matrix reactive pendant groups each of which includes a vinyl-containing moiety in accordance with some embodiments of the present invention.

For example, a glass fiber substrate having its surface modified by an AB-type block copolymer having matrix-reactive pendant groups each of which includes a vinyl-containing moiety in accordance with some embodiments of the present invention is shown in FIG. 3.

One skilled in the art will appreciate that many variations are possible within the scope of the present invention. Thus, while the present invention has been particularly shown and described with reference to preferred embodiments thereof, it will be understood by those skilled in the art that these and other changes in form and details may be made therein without departing from the spirit and scope of the present invention.

What is claimed is:

1. A method for producing an enhanced substrate for a printed circuit board (PCB) comprising:
applying a block copolymer to a substrate comprising glass fiber, wherein the block copolymer comprises a structure represented by the following formula:

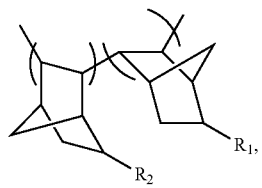

wherein $R_1$ is a silane pendant group that includes a silicon-containing moiety capable of bonding to the glass fiber, and wherein $R_2$ is a matrix-reactive pendant group that includes at least one of a vinyl-, allyl-, amine-, amide- and epoxy-containing moiety capable of reacting with a base polymer;
applying the base polymer to the substrate having the block copolymer applied thereto.

2. The method as recited in claim 1, wherein applying a block copolymer to a substrate comprising glass fiber includes applying the block copolymer to a sheet of woven glass fiber.

3. The method as recited in claim 1, wherein applying a block copolymer to a substrate comprising glass fiber includes applying the block copolymer to the glass fiber as the glass fiber is pulled from a molten state.

4. The method as recited in claim 1, wherein the block copolymer is represented by the following formula:

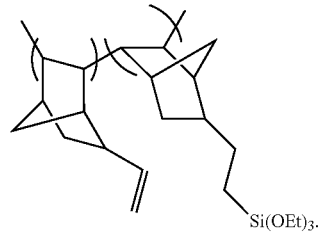

5. The method as recited in claim 1, wherein the block copolymer is represented by the following formula:

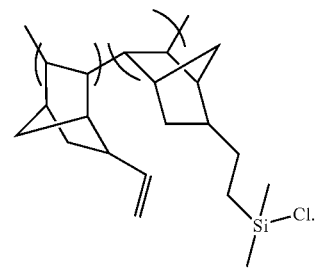

6. The method as recited in claim 1, wherein the base polymer comprises a vinyl-containing resin, and wherein the matrix-reactive pendant group includes at least one of a vinyl- and allyl-containing moiety.

7. The method as recited in claim 1, wherein the base polymer comprises epoxy resin, and wherein the matrix-reactive pendant group includes at least one of an amine-, amide- and epoxy-containing moiety.

8. An enhanced substrate produced according to claim 1.

9. A printed circuit board (PCB) comprising at least one enhanced substrate according to claim 8.

10. A method for synthesizing a block copolymer, comprising:
polymerizing a silane-functionalized norbornene monomer in the presence of a catalyst system comprising a Ziegler-Natta catalyst and cocatalyst using Ziegler-Natta polymerization to produce a polynorbornene homopolymer, wherein the silane-functionalized norbornene monomer is represented by the following formula:

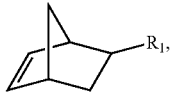

wherein $R_1$ is a silane pendant group that includes a silicon-containing moiety;

polymerizing a matrix-reactive functionalized norbornene monomer in the presence of the polynorbornene homopolymer and a multi-component catalyst system comprising a Ziegler-Natta catalyst and cocatalyst using sequential addition and Ziegler-Natta polymerization, wherein the matrix-reactive functionalized norbornene monomer is represented by the following formula:

wherein $R_2$ is a matrix-reactive pendant group that includes at least one of a vinyl-, allyl-, amine-, amide- and epoxy-containing moiety.

11. The method as recited in claim 10, wherein polymerizing a matrix-reactive functionalized norbornene monomer in the presence of the polynorbornene homopolymer and a multi-component catalyst system comprising a Ziegler-Natta catalyst and cocatalyst using sequential addition and Ziegler-Natta polymerization produces a block copolymer having the following formula:

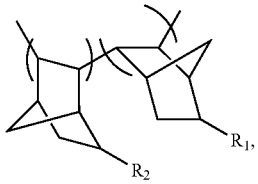

wherein $R_1$ is a silane pendant group that includes a silicon-containing moiety, and wherein $R_2$ is a matrix-reactive pendant group that includes at least one of a vinyl-, allyl-, amine-, amide- and epoxy-containing moiety.

12. The method as recited in claim 10, wherein the silane-functionalized norbornene monomer includes a trialkoxysilane-containing norbornene monomer having the following formula:

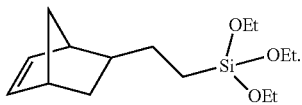 [SMILES: CCO[Si](CCC1CC2C=CC1C2)(OCC)OCC]

13. The method as recited in claim 12, wherein the matrix-reactive functionalized norbornene monomer includes vinyl norbornene monomer.

14. The method as recited in claim 10, wherein the silane-functionalized norbornene monomer includes a dimethylsilyl chloride-containing norbornene monomer having the following formula:

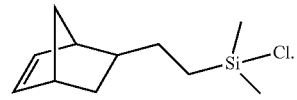

15. The method as recited in claim 14, wherein the matrix-reactive functionalized norbornene monomer includes vinyl norbornene monomer.

16. The method as recited in claim 10, wherein the multi-component catalyst system comprises $TiCl_3$ and $Et_2AlCl$ as the Ziegler-Natta catalyst and cocatalyst, respectively.

17. The method as recited in claim 16, wherein each of the polymerizations includes heating the reaction to between 80 to 100° C.

* * * * *